(12) United States Patent
Tabata et al.

(10) Patent No.: US 9,685,343 B2
(45) Date of Patent: Jun. 20, 2017

(54) METHOD FOR PRODUCING POLISHED OBJECT AND POLISHING COMPOSITION KIT

(71) Applicant: FUJIMI INCORPORATED, Kiyosu-shi, Aichi (JP)

(72) Inventors: Makoto Tabata, Kiyosu (JP); Shinichiro Takami, Kiyosu (JP); Shogaku Ide, Kiyosu (JP)

(73) Assignee: FUJIMI INCORPORATED, Kiyosu-Shi (JP)

(*) Notice: Subject to any disclaimer, the term of this patent is extended or adjusted under 35 U.S.C. 154(b) by 0 days.

(21) Appl. No.: 14/910,803

(22) PCT Filed: Jun. 12, 2014

(86) PCT No.: PCT/JP2014/065650
§ 371 (c)(1),
(2) Date: Feb. 8, 2016

(87) PCT Pub. No.: WO2015/019706
PCT Pub. Date: Feb. 12, 2015

(65) Prior Publication Data
US 2016/0189973 A1 Jun. 30, 2016

(30) Foreign Application Priority Data

Aug. 9, 2013 (JP) ................................. 2013-166142

(51) Int. Cl.
*H01L 21/306* (2006.01)
*C09G 1/02* (2006.01)
(Continued)

(52) U.S. Cl.
CPC ........ *H01L 21/30625* (2013.01); *B24B 37/28* (2013.01); *C09G 1/02* (2013.01);
(Continued)

(58) Field of Classification Search
CPC ........ H01L 21/30625; H01L 21/02024; C09G 1/02; C09K 3/1409; C09K 3/1436; C09K 3/1463

See application file for complete search history.

(56) References Cited

U.S. PATENT DOCUMENTS

| | | | |
|---|---|---|---|
| 2002/0023389 A1 | 2/2002 | Minamihaba et al. | |
| 2004/0098924 A1* | 5/2004 | Iwasa ..................... | C09G 1/02 51/302 |

(Continued)

FOREIGN PATENT DOCUMENTS

| | | |
|---|---|---|
| JP | 2004-349426 A | 12/2004 |
| JP | 2008-098652 A | 4/2008 |

(Continued)

OTHER PUBLICATIONS

Japanese Office Action dated Aug. 30, 2016 as issued in corresponding Japanese Application No. 2015-530734 and its English translation thereof.

*Primary Examiner* — Duy Deo
(74) *Attorney, Agent, or Firm* — Foley & Lardner LLP

(57) ABSTRACT

[Problem] To provide a method for producing a polished object, which can remarkably reduce a haze level on a surface of the object to be polished while defects are significantly reduced.
[Solution] A method for producing a polished object, which includes a double-side polishing step in which an object to be polished is subjected to double-side polishing using a double-side polishing composition including first abrasive grains having an average primary particle diameter of 40 nm or more and a nitrogen-containing water-soluble polymer to obtain a double-side polished object; and a single-side polishing step in which the double-side polished object is subjected to single-side polishing using a single-side polishing composition including second abrasive grains having
(Continued)

an average primary particle diameter of 40 nm or less and a water-soluble polymer, and in which a ratio of an average primary particle diameter (A) of the first abrasive grains with respect to an average primary particle diameter (B) of the second abrasive grains (A)/(B) is more than 1 and 2.5 or less.

10 Claims, 2 Drawing Sheets

(51) Int. Cl.
    *H01L 21/02*     (2006.01)
    *C09K 3/14*     (2006.01)
    *B24B 37/28*     (2012.01)

(52) U.S. Cl.
    CPC .......... *C09K 3/1409* (2013.01); *C09K 3/1436* (2013.01); *C09K 3/1463* (2013.01); *H01L 21/02024* (2013.01)

(56) References Cited

U.S. PATENT DOCUMENTS

| | | |
|---|---|---|
| 2004/0235396 A1 | 11/2004 | Hattori et al. |
| 2008/0087644 A1 | 4/2008 | Nishioka et al. |
| 2010/0252774 A1 | 10/2010 | Shida et al. |
| 2015/0014579 A1* | 1/2015 | Miwa ................ H01L 21/02024 252/79.5 |

FOREIGN PATENT DOCUMENTS

| | | |
|---|---|---|
| JP | 2009-206240 A | 9/2009 |
| JP | 2010-258418 A | 11/2010 |
| JP | 2011-119405 A | 6/2011 |
| JP | 2011-165909 A | 8/2011 |
| JP | 2012-169649 A | 9/2012 |
| JP | 2013-110253 A | 6/2013 |
| JP | 2013-140647 A | 7/2013 |

* cited by examiner

US 9,685,343 B2

METHOD FOR PRODUCING POLISHED OBJECT AND POLISHING COMPOSITION KIT

TECHNICAL FIELD

The present invention relates to a method for producing a polished object and a polishing composition kit.

BACKGROUND ART

For example, a metal and a semiconductor such as silicon, aluminum, nickel, tungsten, copper, tantalum, titanium, or stainless steel, and an alloy thereof; a glassy substance such as quartz glass, aluminosilicate glass, or glassy carbon; a ceramic material such as alumina, silica, sapphire, silicon nitride, tantalum nitride, or titanium carbide; a compound semiconductor wafer material such as silicon carbide, gallium nitride, or gallium arsenide; and a resin material such as a polyimide resin are polished according to various requests such as flattening, and are applied in various fields.

Above all, in order to produce a semiconductor device such as an integrated circuit, various studies on a technique for polishing a silicon wafer have been performed to produce a mirror wafer having a high-quality flat mirror surface without scratches or impurities.

A polishing step of a semiconductor wafer such as a silicon wafer may be performed by at least two stages of preliminary polishing and final polishing. In the preliminary polishing, rough polishing is performed in order to flatten a surface or improve surface roughness. The final polishing is performed in order to improve haze (cloudiness) or remove polishing defects.

In such multi-stage polishing, Patent Literature 1 focuses on the following point. That is, when a subsequent polishing step is performed while abrasive grains in a polishing composition used in a preceding polishing step remain on a wafer surface after completion of polishing, in the subsequent polishing step, defects caused by polishing, such as scratches, are generated on the wafer surface due to the remaining abrasive grains. Patent Literature 1 discloses a polishing composition in which (1) the particle diameter of abrasive grains included (polishing abrasive grains before a final step) is equal to or more than that of abrasive grains in a polishing composition used in a polishing step two stages before the final step (polishing abrasive grains two stages before final step) and (2) the concentration of the polishing abrasive grains before the final step is equal to or less than that of polishing abrasive grains two stages before the final step in a polishing composition used in the polishing step two stages before the final step. Patent Literature 1 discloses a technique to obtain a semiconductor wafer having a high quality of surface, which can be adapted to a highly integrated device.

Haze generated on the surface of the semiconductor wafer during wafer processing not only affects electrical characteristics and a yield of the semiconductor device but also reduces a detection limit when particles adhering to the wafer surface are measured by a particle counter. A haze level of the surface of the semiconductor wafer obtained by a producing method by precisely polishing the surface using a conventional polishing composition is becoming insufficient because in the present, the quality required for the semiconductor wafer is becoming more severe due to the high performance and high integration density of the semiconductor device. According to more detailed semiconductor device design rules, similarly, LLS (Localized Light Scatters) which are a kind of defects observed on the wafer surface after polishing is performed using a polishing composition, are required to have a higher quality because the LLS affect the performance of the semiconductor device.

In this point, even when polishing is performed using the polishing method disclosed in Patent Literature 1, an amount of haze cannot be reduced, and defects cannot be removed sufficiently.

CITATION LIST

Patent Literature

Patent Literature 1: JP-2011-165909 A

SUMMARY OF INVENTION

Technical Problem

The present invention has been achieved in view of such circumstances. An object thereof is to provide a method for producing a polished object, which can remarkably reduce a haze level of a surface of an object to be polished while defects are significantly reduced, and a polishing composition kit which can be used therefor.

Solution to Problem

The present inventors have performed intensive studies. As a result, focusing on a composition of a double-side polishing composition used in double-side polishing and a single-side polishing composition used in single-side polishing, the present inventors have made the particle diameter of abrasive grains used in double-side polishing relatively large, have set a minimum particle diameter of the abrasive grains used in double-side polishing and a maximum particle diameter of the abrasive grains used in single-side polishing, and have made the particle diameter of the abrasive grains used in double-side polishing not uselessly larger than the particle diameter of the abrasive grains used in the single-side polishing so as to be in a specific range. Furthermore, in particular, the present inventors have found that the above-described problems can be solved by using a specific polymer in double-side polishing, and have completed the present invention.

That is, the present invention solves the above-described problems by providing a method for producing a polished object, which includes a double-side polishing step in which an object to be polished is subjected to double-side polishing using a double-side polishing composition including first abrasive grains having an average primary particle diameter of 40 nm or more and a nitrogen-containing water-soluble polymer to obtain a double-side polished object; and a single-side polishing step in which the double-side polished object is subjected to single-side polishing using a single-side polishing composition including second abrasive grains having an average primary particle diameter of 40 nm or less and a water-soluble polymer, and in which a ratio of an average primary particle diameter (A) of the first abrasive grains with respect to an average primary particle diameter (B) of the second abrasive grains (A)/(B) is more than 1 and 2.5 or less.

In addition, the present invention solves the above-described problems by providing a polishing composition kit which includes first abrasive grains having an average primary particle diameter of 40 nm or more, used in double-side polishing, a nitrogen-containing water-soluble polymer used in double-side polishing, second abrasive grains having an average primary particle diameter of 40 nm or less, used in single-side polishing, and a water-soluble polymer used in single-side polishing, and in which the ratio of the average primary particle diameter (A) of the first abrasive grains with respect to the average primary particle diameter (B) of the second abrasive grains (A)/(B) is more than 1 and 2.5 or less.

Advantageous Effect of the Invention

According to the present invention, it is possible to provide a method for producing a polished object, which can remarkably reduce a haze level of a surface of an object to be polished while defects are significantly reduced, and a polishing composition kit which can be used therefor. As other effects of the present invention, it is possible to provide a method for producing a polished object, which can lower a laser marking height and improve a numerical value of ESFQR indicating local flatness of a wafer edge portion, and a polishing composition kit which can be used therefor.

DESCRIPTION OF EMBODIMENTS

Figure 1:
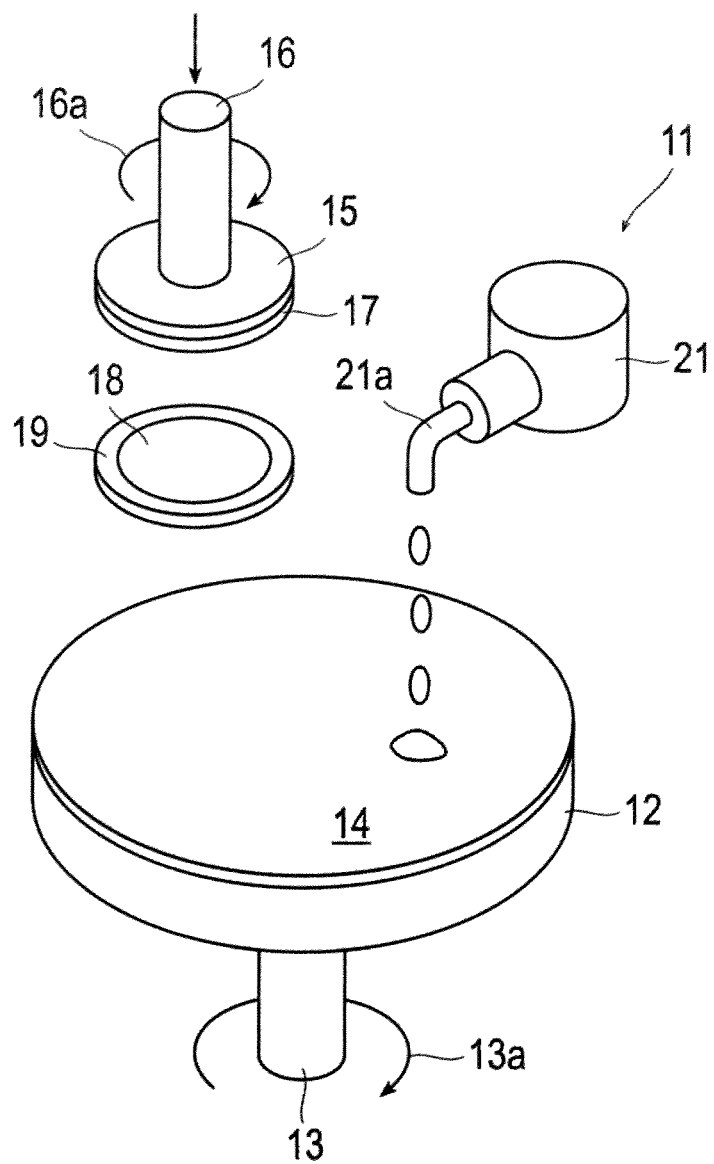
FIG. 1 is a perspective view illustrating an embodiment of a single-side polishing apparatus used in polishing using a single-side polishing composition.

Hereinafter, embodiments of the present invention will be described. The present invention is not limited only to the following embodiments. The dimension ratio of the drawings is exaggerated for convenience of explanation, and may be different from the actual ratio. Here, "X to Y" indicating a range means "X or more and Y or less." "Weight" and "mass", "% by weight" and "% by mass", and "part by weight" and "part by mass" are regarded as the synonyms. Unless otherwise specified, operations and measurement of physical properties or the like are performed under the conditions of room temperature (20 to 25° C.)/relative humidity of 40 to 50%.

A first aspect of the present invention is a method for producing a polished object, which includes a double-side polishing step in which an object to be polished is subjected to double-side polishing using a double-side polishing composition including first abrasive grains having an average primary particle diameter of 40 nm or more and a nitrogen-containing water-soluble polymer to obtain a double-side polished object, and a single-side polishing step in which the double-side polished object is subjected to single-side polishing using a single-side polishing composition including second abrasive grains having an average primary particle diameter of 40 nm or less and a water-soluble polymer, and in which a ratio of an average primary particle diameter (A) of the first abrasive grains with respect to an average primary particle diameter (B) of the second abrasive grains (A)/(B) is more than 1 and 2.5 or less.

As described above, focusing on a composition between a double-side polishing composition used in double-side polishing and a single-side polishing composition used in single-side polishing, the present inventors have made the particle diameter of abrasive grains used in double-side polishing relatively large, have set a minimum particle diameter of the abrasive grains used in double-side polishing and a maximum particle diameter of the abrasive grains used in single-side polishing, and have made the particle diameter of the abrasive grains used in double-side polishing not uselessly larger than the particle diameter of the abrasive grains used in single-side polishing. Furthermore, in particular, by using a specific polymer in double-side polishing, the present inventors have found that it is possible to remarkably reduce a haze level of a surface of an object to be polished while defects can be significantly reduced.

The object to be polished used in a producing method of the first aspect of the present invention is not particularly limited. Examples thereof include a metal and a semiconductor wafer such as silicon, aluminum, nickel, tungsten, copper, tantalum, titanium, or stainless steel, and an alloy thereof; a glassy substance such as quartz glass, aluminosilicate glass, or glassy carbon; a ceramic material such as alumina, silica, sapphire, silicon nitride, tantalum nitride, or titanium carbide; a compound semiconductor wafer material such as silicon carbide, gallium nitride, or gallium arsenide; and a resin material such as a polyimide resin. The shape of the object to be polished is not particularly limited, either. For example, the producing method can be preferably applied to polishing an object to be polished, having a flat surface such as plate-shape, polyhedron shape. By polishing such an object to be polished, it is possible to produce a polished object which can remarkably reduce a haze level while defects are significantly reduced. Among these objects to be polished, the object to be polished may include a plurality of materials. Above all, the object to be polished is preferably a semiconductor wafer. The producing method of the first aspect of the present invention is particularly preferable for polishing an object to be polished having a surface formed of single crystal or polycrystalline silicon.

Hereinafter, an embodiment of the first aspect of the present invention in which the object to be polished is a silicon wafer will be described mainly. Of course, the object to be polished is not limited to a silicon wafer. The above-described examples can be used.

The silicon wafer used in the producing method of the first aspect of the present invention may be p-type or n-type. The crystal orientation of the silicon wafer is not particularly limited, and may be any one of <100>, <110>, and <111>. Resistivity of the silicon wafer is not particularly limited. The thickness of the silicon wafer is, for example, 600 to 1000 μm, but is not particularly limited. The producing method of the first aspect of the present invention can be applied to a wafer having any diameter such as 200 mm, 300 mm, or 450 mm. Particularly, the producing method of the first aspect of the present invention essentially includes a double-side polishing step, and therefore can be applied to a wafer having a large diameter such as 300 mm or 450 mm. Of course, a wafer having a diameter other than these diameters may be used.

Subsequently, a processing process of the silicon wafer will be described. A silicon single crystal ingot is sliced, and a silicon wafer is produced (slicing step). Thereafter, edges of the silicon wafer are bevelled (beveling step). Then, a wafer surface is roughly polished by lapping and adjusted into a predetermined shape (lapping step). Furthermore, the surface layer of the silicon wafer which has changed in quality due to lapping is removed (the processing quality-changed layer of the wafer is removed), and the silicon wafer is etched (etching process). After etching, the edges and the surface (double-side or single-side) of the silicon wafer are polished (polishing step), and then the silicon wafer is cleaned (cleaning step). The silicon wafer may be rinsed (rinsing step) between the polishing steps or between the polishing step and the cleaning step.

The producing method of the first aspect of the present invention is characterized in producing a polished object produced in the polishing step among the series of processes. In the polishing step of the present embodiment, the surface (double-side or single-side) of the silicon wafer is bought into contact with a polishing pad, and the wafer surface and the polishing pad are relatively slided while a polishing composition (double-side polishing composition or single-side polishing composition) is supplied to the contact portion. The wafer surface is thereby polished. In a preferable embodiment of the first aspect of the present invention, the double-side polishing step is a rough polishing step (preliminary polishing step), and the single-side polishing step is a final polishing step. In the preferable embodiment of the first aspect of the present invention, the double-side polishing step is performed once and the single-side polishing step is performed once (first embodiment of the first aspect of the present invention, described in detail below). In the preferable embodiment of the first aspect of the present invention, the double-side polishing step is performed once and the single-side polishing step is performed twice (second embodiment of the first aspect of the present invention, described in detail below). As a modification example of the second embodiment of the first aspect of the present invention, the double-side polishing step is performed multiple times, and the single-side polishing step is performed three or more times. In the preferable embodiment of the first aspect of the present invention, the silicon wafer is rinsed whenever each step is finished (that is, after the double-side polishing step, after the single-side polishing step, after each step when the single-side polishing step is performed multiple times, or after each step when the double-side polishing step is performed multiple times) in order to switch polishing compositions, remove polishing waste, or protect the wafer surface.

Subsequently, a polishing apparatus will be described. FIG. 1 is a perspective view illustrating a single-side polishing apparatus used in polishing using a single-side polishing composition. This single-side polishing apparatus may be used in the rinsing step using a rinsing composition. As illustrated in FIG. 1, a single-side polishing apparatus 11 includes a disc-shaped rotary plate 12 to the top surface of which a polishing pad 14 is stuck. The rotary plate 12 is provided so as to be integrally rotatable with respect to a first shaft 13 rotating in an arrow 13a direction in FIG. 1. At least one wafer holder 15 is provided above the rotary plate 12. The wafer holder 15 is provided so as to be integrally rotatable with respect to a second shaft 16 rotating in an arrow 16a direction in FIG. 1. A wafer holding plate 19 having a wafer holding hole 18 is detachably attached to the bottom surface of the wafer holder 15 via a ceramic plate 17 and a urethane sheet (not illustrated). The single-side polishing apparatus 11 may further include a polishing composition feeder 21 and a rinsing composition feeder (not illustrated). The polishing composition feeder 21 may discharge a single-side polishing composition through a nozzle 21a. The rinsing composition feeder (not illustrated) may discharge a rinsing composition through a nozzle (not illustrated). The polishing composition feeder 21 of the single-side polishing apparatus 11 not including a rinsing composition feeder (not illustrated) or a nozzle may discharge a rinsing composition through the nozzle 21a.

When a silicon wafer is polished, the polishing composition feeder 21 is disposed above the rotary plate 12 as illustrated in FIG. 1. A silicon wafer to be polished is sucked into the wafer holding hole 18 and is held in the wafer holder 15. First, the wafer holder 15 and the rotary plate 12 start to rotate, and a single-side polishing composition is discharged from the polishing composition feeder 21, and the single-side polishing composition is supplied onto the polishing pad 14. Then, the wafer holder 15 is moved toward the rotary plate 12 (also referred to as a lower plate 23 in a double-side polishing apparatus 22 described below) in order to press the silicon wafer onto the polishing pad 14. One side of the silicon wafer in contact with the polishing pad 14 is thereby polished. The polishing pad is not particularly limited, and a polyurethane type, a nonwoven fabric type, a suede type, or the like can be used.

Figure 2:
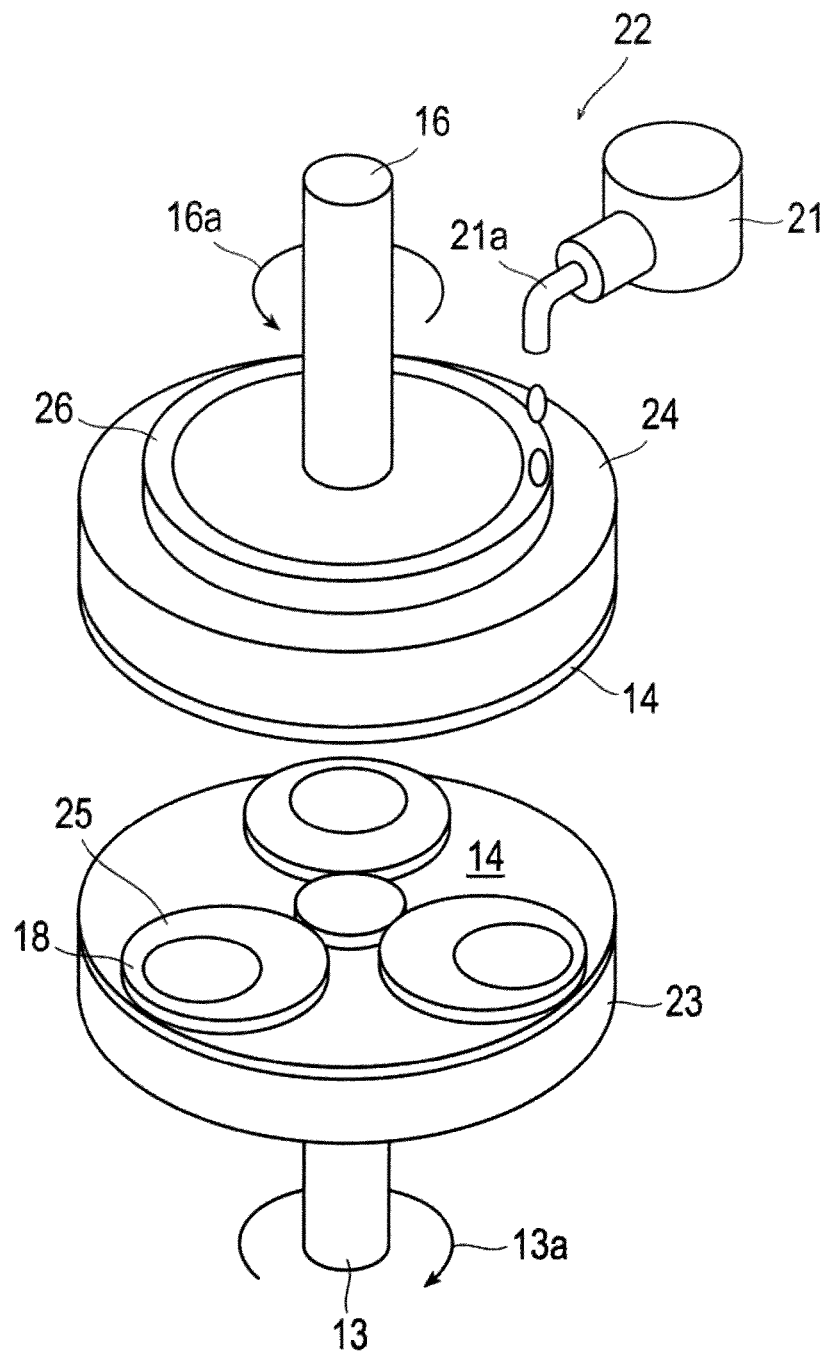
FIG. 2 is a perspective view illustrating an embodiment of a double-side polishing apparatus used in polishing using a double-side polishing composition.

By including another disc-shaped rotary plate to which a polishing pad is stuck, the single-side polishing apparatus illustrated in FIG. 1 can be used as a double-side polishing apparatus for polishing both sides of the silicon wafer. FIG. 2 is a perspective view illustrating an embodiment of a double-side polishing apparatus used in polishing using a double-side polishing composition.

In an embodiment of a double-side polishing apparatus of the first aspect of the present invention, a disc-shaped rotary plate to which a polishing pad is stuck is further disposed above to be used as an upper rotary plate (upper plate 24) to which a polishing pad 14 is stuck. The silicon wafer held by the wafer holding hole 18 is held by the polishing pad 14 stuck to the lower plate 23 and the polishing pad 14 stuck to the upper plate 24. The upper rotary plate includes a flowing hole for a double-side polishing composition (polishing composition feeding gutter 26) to make a double-side polishing composition discharged from the polishing composition feeder 21 flow out in a lower part. The upper rotary plate (upper plate 24) and the lower rotary plate (lower plate 23) rotate in opposite directions as illustrated in arrows 13a and 16a. A double-side polishing composition is discharged from the double-side polishing composition feeder 21, and the both polishing pads 14 rotate while pressing both sides of the silicon wafer. The both sides of the silicon wafer are thereby polished. As illustrated in FIG. 2, in the double-side polishing apparatus 22, the wafer holder 15 illustrated in FIG. 1 is not necessary. In place of the wafer holder 15, a wafer holding plate having one wafer holding hole 18 is necessary. These are referred to as a wafer holder or a processing carrier 25 as a whole. According to the embodiment illustrated in FIG. 2, one holding plate includes one wafer, and three holding plates are disposed. However, according to another embodiment, one holding plate may include three wafers. In the present invention, any apparatus can be used. The number of the holding plate or the number of the wafer held by one holding plate is not particularly limited. A conventionally known apparatus can be used as it is or by appropriately improving the conventionally known apparatus.

A rotation speed can be selected appropriately. However, in double-side polishing, the rotation speed is usually about 10 to 50 rpm, and preferably about 15 to 30 rpm. In this case, the rotation speeds of the upper rotary plate and the lower rotary plate may be different from each other, but are usually set to the same relative speed with respect to the wafer. In single-side polishing, the rotation speed is usually about 10 to 100 rpm, and preferably about 20 to 50 rpm. With such a rotational speed, it is possible to remarkably reduce the haze level of the surface of the silicon wafer (double-side or single-side). In addition, it is possible to significantly reduce defects, to lower a laser marking height, and to improve a numerical value of ESFQR. As described above, the silicon wafer is usually pressurized by the plate. In this case, the pressure can be selected appropriately. However, in double-side polishing, the pressure is usually preferably about 5 to 25 kPa, more preferably about 10 to 15 kPa. In single-side polishing, the pressure is usually preferably about 5 to 25 kPa, more preferably about 10 to 15 kPa. With such a pressure, it is possible to remarkably reduce the haze level of the surface of the silicon wafer. In addition, it is possible to significantly reduce defects, to lower a laser marking height, and to improve a numerical value of ESFQR.

A feeding speed of a polishing composition (double-side polishing composition or single-side polishing composition) can be selected appropriately according to the size of the plate. However, in view of the economic efficiency, in double-side polishing, the feeding speed of a double-side polishing composition is usually preferably about 1 to 10 L/min, and more preferably about 2 to 5 L/min. In single-side polishing, the feeding speed of a single-side polishing composition is usually preferably about 0.1 to 5 L/min, preferably about 0.5 to 2 L/min. With such a feeding speed, it is possible to polish the surface of the silicon wafer efficiently and to remarkably reduce the haze level of the surface of the silicon wafer. In addition, it is possible to significantly reduce defects, to lower a laser marking height, and to improve a numerical value of ESFQR. The holding temperature in a polishing apparatus of a polishing composition (double-side polishing composition or single-side polishing composition) is not particularly limited. However, the holding temperature is usually preferably about 15 to 40° C., more preferably about 18 to 25° C. from viewpoints of stability of the polishing speed and reduction in the haze level. The above-described polishing conditions are only examples. The polishing conditions may be outside the above-described range, or the settings may be changed appropriately.

When a polished silicon wafer is rinsed, a rinsing composition feeder is disposed above the rotary plate 12 in place of the polishing composition feeder 21. A polishing composition in the polishing composition feeder 21 may be discharged, and a rinsing composition may be put thereinto in place of the polishing composition. After operation conditions of the single-side polishing apparatus 11 are switched from the settings for polishing to the settings for rinsing, a rinsing composition is discharged from the rinsing composition feeder and fed onto the polishing pad 14. The surface of the silicon wafer in contact with the polishing pad 14 is thereby rinsed. In the rinsing step, a polishing composition to be used in a subsequent step may be used as a rinsing composition as it is, or a composition obtained by removing abrasive grains from the polishing composition to be used in the subsequent step may be used as a rinsing composition. When a polishing composition is used as a rinsing composition, components of the polishing composition may be increased or reduced, or may be diluted with water if necessary.

Hereinafter, the first aspect of the present invention will be described by dividing the first aspect into several embodiments.

First Embodiment of the First Aspect of the Present Invention

In the first embodiment of the first aspect of the present invention, a double-side polishing step in which a silicon wafer is subjected to double-side polishing using a double-side polishing composition to obtain a double-side polished silicon wafer is performed once, and a single-side polishing step in which the double-side polished silicon wafer is subjected to single-side polishing using a single-side polishing composition is performed once. Performing each step once is preferable from viewpoints of efficient polishing, reduction in cost, and a wastewater treatment.

[Abrasive Grains]

Abrasive grains polish a surface of an object to be polished mechanically. Specific examples of the abrasive grains include particles made of a metal oxide such as silica, alumina, ceria, zirconia, or titania, and particles made of silicon carbide, calcium carbonate, or diamond. One kind of these compounds may be used alone or a combination of two or more kinds thereof may be used. Among the abrasive grains, silica particles are preferable. Examples thereof include colloidal silica and fumed silica. The kind of the first abrasive grains and the kind of the second abrasive grains may be the same as or different from each other, but are preferably the same from a viewpoint of cross contamination (a previous step influences a subsequent step). When the kind of the first abrasive grains is different from that of the second abrasive grains, abrasive grains may be combined appropriately to be used. Colloidal silica is preferable among the silica particles. When colloidal silica or fumed silica is used, particularly when colloidal silica is used, scratches generated on a surface of an object to be polished in a polishing step are to be reduced.

The content of the first abrasive grains in a double-side polishing composition is preferably 0.1% by mass or more, more preferably 0.2% by mass or more. The content of the second abrasive grains in a single-side polishing composition is preferably 0.05% by mass or more, more preferably 0.1% by mass or more. Increase in the content of the abrasive grains improves surface processing performance with respect to a surface to be polished, such as a polishing speed.

The content of the first abrasive grains in a double-side polishing composition is preferably 50% by mass or less, more preferably 45% by mass or less. The content of the second abrasive grains in a single-side polishing composition is preferably 20% by mass or less, more preferably 15% by mass or less. By reduction in the content of the abrasive grains, there is a tendency that dispersion stability of the polishing composition is improved and a residue of the abrasive grains on the polished surface is reduced. The lower limit of the content is particularly based on an assumption of a concentration in a form of dilution described below. The upper limit of the content is particularly based on an assumption of a concentration in a concentrated liquid described below.

The average primary particle diameter (A) of the first abrasive grains used in the double-side polishing composition is not particularly limited as long as the diameter is 40 nm or more. The diameter may be more than 40 nm, 45 nm or more or less, 50 nm or more or less, 53 nm or more or less, 55 nm or more or less, 60 nm or more or less, 65 nm or more or less, 70 nm or more or less, 80 nm or more or less, 85 nm or more or less, 90 nm or more or less, or 92 nm or more or less. When it is required to obtain more effects of the present invention, the diameter is preferably less than 90 nm, more preferably less than 70 nm.

The larger the abrasive grains used are, the closer to zero the laser marking height tends to be. A larger content of a nitrogen-containing water-soluble polymer tends to make the laser marking height closer to zero.

When the abrasive grains used are significantly large, and a dispersion state is excellent to such an extent that the mechanical action of the abrasive grains is exerted, the precision of ESFQR tends to be high. It is possible to particularly improve the laser marking height and ESFQR by using significantly large abrasive grains in the double-side polishing composition. In the present invention, the average primary particle diameter (A) of the first abrasive grains used in the double-side polishing composition is 40 nm or more. The dispersion of the abrasive grains is improved by including a nitrogen-containing water-soluble polymer (in comparison with a case of including no water-soluble polymer or a case of including a water-soluble polymer not containing nitrogen).

The average primary particle diameter (B) of the second abrasive grains is not particularly limited as long as the diameter is 40 nm or less. The diameter may be 38 nm or more or less, 35 nm or more or less, 32 nm or more or less, 30 nm or more or less, 28 nm or more or less, 25 nm or more or less, or 23 nm or more or less. When it is required to obtain more effects of the present invention, the diameter is preferably less than 40 nm. It is possible to particularly reduce LLS and the haze by using significantly small abrasive grains in the single-side polishing composition.

A ratio of the content (concentration) of the second abrasive grains with respect to the content (concentration) of the first abrasive grains is not particularly limited, but is preferably 0.3 to 8 or 1 to 8 from viewpoints of a polishing efficiency and surface precision.

The average secondary particle diameter of the first abrasive grains used in the double-side polishing composition is preferably 50 nm or more, more preferably 80 nm or more, and preferably 250 nm or less, more preferably 180 nm or less from viewpoints of disappearance of the laser marking height and improvement of ESFQR. The average secondary particle diameter of the second abrasive grains used in the single-side polishing composition is more preferably 10 nm or more, and preferably 100 nm or less, more preferably 70 nm or less from a viewpoint of reduction in LLS.

For example, values of the average primary particle diameter and the average secondary particle diameter of the abrasive grains are calculated from a specific surface area measured by a BET method. For example, measurement of the specific surface area of the abrasive grains can be performed by using "Flow SorbII 2300" manufactured by Micromeritics Japan.

In a preferable embodiment of the first aspect of the present invention, the number of LLS having a size of 37 nm or more in a silicon wafer after double-side polishing and single-side polishing is preferably 50 or less, more preferably 20 or less. The smaller the number is, the better the silicon wafer is. The number of LLS in the present invention means a value calculated by a measuring method described in Examples.

In the preferable embodiment of the first aspect of the present invention, the smaller the haze (relative value) of the silicon wafer after double-side polishing and single-side polishing is, the better the silicon wafer is. Specifically, the haze is 26 or less, 25 or less, 24 or less, 23 or less, 22 or less, 21 or less, 20 or less, or 19 or less. However, the substantial lower limit is about 10. The haze (relative value) means a value calculated by a measuring method described in Examples.

In the preferable embodiment of the first aspect of the present invention, the laser marking height of the silicon wafer after double-side polishing and single-side polishing is preferably 50 nm or less, more preferably 30 nm or less. However, the substantial lower limit is about 10 nm. The laser marking is for marking ID or the like in a silicon wafer, and is represented by forming recesses (dots) by irradiating an outer peripheral portion of the silicon wafer with a laser beam and arranging the dots. The laser marking is mainly attached to a portion corresponding to a back surface outer peripheral portion of the silicon wafer. In a case of polishing with a double-side polishing machine, only the parts around the laser marking have a smaller polishing amount as compared to a part having no laser marking because silicon is changed in quality, and therefore a projection is easily generated disadvantageously. Here, the height of the projection is referred to as a laser marking height. The laser marking height means a value calculated by a measuring method described in Examples.

In the preferable embodiment of the first aspect of the present invention, ESFQR of the silicon wafer after double-side polishing and single-side polishing is preferably 70 nm or less, more preferably 50 nm or less. However, the substantial lower limit is about 10 nm. ESFQR (Edge flatness metric, Sector based, Front surface referenced, least squares fit reference plane, Range of the data within sector) means a value obtained by measuring SFQR in a fan-shaped region (sector) formed in an outer peripheral portion of the entire periphery of the wafer. ESFQRmax indicates a maximum value of ESFQRs in all the sectors. ESFQRmean indicates a mean value of ESFQRs in all the sectors. In the present invention, ESFQR means a value of ESFQRmean. ESFQR defined in the present invention is a value obtained by measuring SFQR in a site in which an edge exclusion (width of the outer peripheral portion in which a device is not formed on the wafer) is 1 mm, the entire periphery of the wafer is divided into 72 parts by 5° intervals, and the length of one side in the radial direction constituting the site is 35 mm, using a flatness measurement device (WaferSight2 manufactured by KLA-Tencor Corporation). SFQR (Site Front Least Squares Range) means a maximum deviation on the +side (that is, the upper side when a wafer is placed horizontally with the surface of the wafer facing upward) and the −side (the lower side, similarly) from a reference plane which is a plane in the site obtained by calculating data in the set site by a least square method. ESFQR also means a value calculated by a measuring method described in Examples.

In the preferable embodiment of the first aspect of the present invention, as for a minimum polishing amount in single-side polishing, having the number of LLS of the silicon wafer after double-side polishing and single-side polishing, of 20 or less, the smaller the minimum polishing amount is, the better the silicon wafer is. Specifically, the minimum polishing amount is 550 nm or less, less than 550 nm, 400 nm or less, 350 nm or less, less than 350 nm, 300 nm or less, less than 300 nm, 290 nm or less, 270 nm or less, 250 nm or less, 230 nm or less, or 210 nm or less. However, the substantial lower limit is about 200 nm.

As described above, in the present invention, the ratio (A)/(B) of the average primary particle diameter (A) of the first abrasive grains with respect to the average primary particle diameter (B) of the second abrasive grains is more than 1 and 2.5 or less. Within such a range, it is possible to polish the surface of the silicon wafer efficiently and to remarkably reduce the haze level of the surface of the silicon wafer. In addition, it is possible to significantly reduce defects, to significantly reduce defects, to lower the laser marking height, and to improve the numerical value of ESFQR.

(A)/(B) is only required to be more than 1 and 2.5 or less, but is preferably 1.6 or more and less than 2.3, more preferably more than 1.8 and 2.2 or less, still more preferably 1.9 or more and 2.2 or less. In this case, the particle diameter (B) is preferably less than 40 nm, more preferably less than 35 nm. With such a value, the number of LLS is particularly reduced, the haze (relative value) is particularly reduced, the laser marking height can be particularly lowered, ESFQR is particularly improved, the above-described minimum polishing amount is particularly small, and the polishing speed is high.

When polishing is performed in a final polishing step through a preliminary polishing step, even when each step is individually optimized, optimization of the whole series of polishing processes in both steps is not performed. Therefore, some of the steps may select inappropriate polishing slurry. Specifically, flatness of the polished surface represented by ESFQR, or the polishing speed is important in the preliminary polishing step, and occurrence of defects such as the number of LLS, or the like is important in the final polishing step. However, mismatch occurs between the polishing slurries in the steps, and defects such as the number of LLS cannot be further reduced. Therefore, not only (A)>(B) but also (A)/(B) is preferably within a constant condition range as a balance in the polishing effect between the preliminary polishing step and the final polishing step.

It is one of the characteristics in the producing method of the first aspect of the present invention that the double-side polishing composition in double-side polishing includes a nitrogen-containing water-soluble polymer and the single-side polishing composition in single-side polishing includes a water-soluble polymer. Particularly by including a nitrogen-containing water-soluble polymer in the double-side polishing composition in double-side polishing, it is possible to reduce the number of LLS. In addition, it is possible to lower the laser marking height, and ESFQR is improved.

[Nitrogen-Containing Water-Soluble Polymer]

A nitrogen-containing water-soluble polymer in the double-side polishing composition maintains flatness of from the center to the edges of the object to be polished. The nitrogen-containing water-soluble polymer is not particularly limited as long as the nitrogen-containing water-soluble polymer has one or more nitrogen atoms in a monomer unit or one or more nitrogen atoms in a part of side chain. Examples thereof include an amine, an imine, an amide, an imide, a carbodiimide, a hydrazide, and a urethane compound. Any one of a chain shape, a cyclic shape, a primary compound, a secondary compound, and a tertiary compound may be used. The nitrogen-containing water-soluble polymer may have a structure of a salt formed by using a nitrogen atom as a cation. Either a polymer containing a nitrogen atom in the main chain or a polymer containing a nitrogen atom in a side chain functional group (pendant group) can be used. One kind of the nitrogen-containing water-soluble polymers in the double-side polishing composition may be used or a combination of two or more kinds thereof may be used. However, one kind is preferably used from a viewpoint of production cost.

Examples of the nitrogen-containing water-soluble polymer having a structure of a salt include a quaternary ammonium salt. Examples of the nitrogen-containing water-soluble polymer include a polycondensation polyamide such as water-soluble nylon, a polycondensation polyester such as water-soluble polyester, a polyaddition polyamine, a polyaddition polyimine, a polyaddition (meth)acrylamide, a water-soluble polymer having a nitrogen atom at least in a part of an alkyl main chain, and a water-soluble polymer having a nitrogen atom at least in a part of a side chain. The water-soluble polymer having a nitrogen atom in a side chain includes a water-soluble polymer having a quaternary nitrogen atom in a side chain. A specific example of the polyaddition nitrogen-containing water-soluble polymer is selected from the group consisting of polyvinyl imidazole, polyvinyl carbazole, polyvinyl pyrrolidone, poly N-vinylformamide, polyvinyl caprolactam, and polyvinyl piperidine. The nitrogen-containing water-soluble polymer may partially have a hydrophilic structure such as a vinyl alcohol structure, a methacrylic acid structure, a vinyl sulphonic acid structure, a vinyl alcohol carboxylic acid ester structure, or an oxyalkylene structure. Furthermore, the nitrogen-containing water-soluble polymer may be a polymer having a plurality of kinds of structures, such as a diblock type thereof, a triblock type thereof, a random-type thereof, or an alternating type thereof. The nitrogen-containing water-soluble polymer may have a cation, an anion, both an anion and a cation, or a nonion in a part or the whole of a molecule thereof. One kind of these nitrogen-containing water-soluble polymers may be used alone or a combination of two or more kinds thereof may be used.

Examples of the polymer containing a nitrogen atom in a main chain include a homopolymer and a copolymer of an N-acylalkyleneimine monomer. Specific examples of the N-acylalkyleneimine monomer include N-acetylethyleneimine and N-propionylethyleneimine.

Examples of the polymer containing a nitrogen atom in a pendant group include a polymer containing an N-(meth)acryloyl monomer unit and a polymer containing an N-vinyl monomer unit. Here, the "(meth)acryloyl" means acryl and methacryl inclusively. For example, a homopolymer and a copolymer of N-(meth)acryloyl morpholine, and a homopolymer and a copolymer of N-vinylpyrrolidone can be used. Unless otherwise specified, here, the copolymer inclusively means various copolymers such as a random copolymer, an alternating copolymer, a block copolymer, or a graft copolymer.

Among the nitrogen-containing water-soluble polymers, the nitrogen-containing water-soluble polymer is preferably selected from the group consisting of a copolymer containing polyvinyl piperidone, polyvinyl imidazole, polyvinyl carbazole, or polyvinyl pyrrolidone in a part of the structure, a copolymer containing polyvinyl pyrrolidone, poly N-vinylformamide, or polyvinyl caprolactam in a part of the structure, polyvinyl caprolactam, and polyvinyl piperidine, from viewpoints of reduction in the number of LLS, lowering the laser marking height, and improvement of ESFQR. The nitrogen-containing water-soluble polymer is preferably selected from the group consisting of polyvinyl pyrrolidone and poly N-vinylformamide from a viewpoint of an ability to form a film for protecting the wafer surface.

The weight average molecular weight of the nitrogen-containing water-soluble polymer in the double-side polishing composition is preferably about 2000 to 250000, more preferably about 3000 to 200000, still more preferably about 4000 to 150000 in terms of polyethylene oxide. Within such a range, the intended effects of the present invention are easily exhibited.

The content of the nitrogen-containing water-soluble polymer in the double-side polishing composition is preferably 0.001 to 0.03% by mass, more preferably 0.002 to 0.02% by mass, still more preferably 0.005 to 0.02% by mass, particularly preferably 0.005 to 0.01% by mass. Within such a range, the intended effects of the present invention are easily exhibited.

Such a range is particularly based on an assumption of a concentration in a concentrated liquid described below.

[Water-Soluble Polymer]

A water-soluble polymer enhances wettability of a surface to be polished. One kind of the water-soluble polymers in the single-side polishing composition may be used or a combination of two or more kinds thereof may be used. However, one kind or two kinds are preferably used from a viewpoint of production cost.

A water-soluble polymer having at least one functional group selected from a cation group, an anion group, and a nonion group in the molecule can be used. Specific examples of the water-soluble polymer include water-soluble polymers having a hydroxyl group, a carboxyl group, an acyloxy group, a sulfo group, a quaternary ammonium structure, a heterocyclic structure, a vinyl structure, or a polyoxyalkylene structure in the molecule. A nonionic water-soluble polymer can be preferably used from viewpoints of reduction in agglomerates and improvement of cleaning performance. Preferable examples thereof include a polymer containing an oxyalkylene unit, a polymer containing a nitrogen atom (nitrogen-containing water-soluble polymer described above), polyvinyl alcohol (polyvinyl alcohol having a saponification degree of 70 mol % or more), and a cellulose derivative.

Examples of the polymer containing an oxyalkylene unit include polyethylene oxide (PEO), a block copolymer of ethylene oxide (EO) and propylene oxide (PO), and a random copolymer of EO and PO. The block copolymer of EO and PO may be a diblock copolymer or a triblock copolymer containing a polyethylene oxide (PEO) block and a polypropylene oxide (PPO) block. The above triblock copolymer includes a PEO-PPO-PEO type triblock copolymer and a PPO-PEO-PPO type triblock copolymer. Usually, the PEO-PPO-PEO type triblock copolymer is more preferable. In the block copolymer or the random copolymer of EO and PO, the molar ratio of EO and PO included in the copolymer (EO/PO) is preferably more than 1, more preferably 2 or more, still more preferably 3 or more (for example, 5 or more) from viewpoints of solubility in water, cleaning performance, and the like.

More specific examples include a cellulose derivative, an imine derivative such as poly(N-acylalkyleneimine), polyvinyl alcohol, polyvinyl pyrrolidone, a copolymer containing polyvinyl pyrrolidone in a part of the structure, polyvinyl caprolactam, a copolymer containing polyvinyl caprolactam in a part of the structure, polyoxyethylene, a polymer containing an oxyalkylene unit, a polymer having a plurality of kinds of structures such as a diblock type thereof, a triblock type thereof, a random type thereof, or an alternating type thereof, and polyether-modified silicone.

Among these compounds, a cellulose derivative, polyvinyl alcohol, polyvinyl pyrrolidone, and a polymer containing an oxyalkylene unit are preferable. Specific examples of the cellulose derivative include a cellulose derivative such as hydroxyethyl cellulose, hydroxypropyl cellulose, hydroxyethylmethyl cellulose, methyl cellulose, hydroxypropylmethyl cellulose, methyl cellulose, ethyl cellulose, ethylhydroxyethyl cellulose, or carboxymethyl cellulose, and pullulan. Among the cellulose derivatives, hydroxyethyl cellulose is preferable from viewpoints of high ability to impart wettability to a polished surface and excellent cleaning performance. By combining polyvinyl pyrrolidone with a cellulose derivative as a water-soluble polymer included in the single-side polishing composition, agglomerates in the polishing composition can be suppressed. Therefore, the number of LLS is reduced, the haze is reduced, the laser marking height is lowered, and ESFQR is improved.

The weight average molecular weight of the water-soluble polymer in the single-side polishing composition is preferably about 20000 to 400000, more preferably about 30000 to 350000, still more preferably about 40000 to 300000 in terms of polyethylene oxide. Within such a range, the intended effects of the present invention are easily exhibited.

The content of the water-soluble polymer in the single-side polishing composition is preferably 0.05% by mass or more, more preferably 0.08% by mass or more, still more preferably 0.1% by mass or more, and preferably 1.0% by mass or less, more preferably 0.7% by mass or less, still more preferably 0.5% by mass or less. Within such a range, the intended effects of the present invention are easily exhibited.

Such a range is particularly based on an assumption of a concentration in a concentrated liquid described below.

The concentration of the water-soluble polymer in the single-side polishing composition is preferably higher than that of the nitrogen-containing water-soluble polymer in the double-side polishing composition from a viewpoint of protecting a surface of an object to be polished. The ratio in this case is not particularly limited, but is preferably ten times or more, more preferably 20 times or more, still more preferably 50 times or more, and preferably 1000 times or less, more preferably 200 times or less, still more preferably 100 times or less. Within such a range, it is possible to polish a surface of an object to be polished efficiently and to remarkably reduce the haze level of the surface of the object to be polished. In addition, it is possible to significantly reduce defects, to lower a laser marking height, and to improve a numerical value of ESFQR.

Each of the double-side polishing composition and the single-side polishing composition used in the producing method of the first aspect of the present invention preferably includes a third component such as water, a basic compound, a surfactant, or a chelating agent in addition to the above-described components.

[Water]

Water in the polishing composition (double-side polishing composition or single-side polishing composition) dissolves or disperses other components. In order to avoid a hindrance to actions of other components as much as possible, the total content of transition metal ions in water is preferably 100 ppb or less. For example, the purity of water can be increased by removal of impurity ions using an ion exchange resin, removal of foreign matters using a filter, or distillation. Specifically, for example, ion exchange water, pure water, ultrapure water, or distilled water is preferably used.

The pH of the polishing composition is preferably in a range of 8 to 12, more preferably in a range of 9 to 11.

For preparing the above-described polishing composition, for example, it is possible to use a known mixing apparatus such as a wing-type stirrer, an ultrasonic dispersion machine, or a homomixer. Raw materials of the polishing composition may be mixed simultaneously, or the order of mixing may be set appropriately.

[Basic Compound]

A basic compound chemically polishes a surface of an object to be polished and improves dispersion stability of the polishing composition (double-side polishing composition or single-side polishing composition).

Specific examples of the basic compound include a hydroxide or a salt of alkali metal, quaternary ammonium hydroxide or a salt thereof, ammonia, and an amine. Examples of the alkali metal include potassium and sodium. Examples of the salt include a carbonate, a bicarbonate, a sulfate, and an acetate. Examples of the quaternary ammonium include tetramethylammonium, tetraethylammonium, and tetrabutylammonium.

Examples of the quaternary ammonium hydroxide compound include quaternary ammonium hydroxide and a salt thereof. Specific examples thereof include tetramethylammonium hydroxide, tetraethylammonium hydroxide, and tetrabutylammonium hydroxide.

Specific examples of the amine include methylamine, dimethylamine, trimethylamine, ethylamine, diethylamine, triethylamine, ethylenediamine, monoethanolamine, N-(β-aminoethyl)ethanolamine, hexamethylenediamine, diethylenetriamine, triethylenetetramine, anhydrous piperazine, piperazine hexahydrate, 1-(2-aminoethyl)piperazine, N-methylpiperazine, and guanidine. One kind of these basic compounds may be used alone or a combination of two or more kinds thereof may be used.

Among the basic compounds, at least one selected from ammonia, an ammonium salt, a hydroxide of alkali metal, an alkali metal salt, and a quaternary ammonium hydroxide compound is preferably used.

Among the basic compounds, at least one selected from ammonia, a potassium compound, sodium hydroxide, a quaternary ammonium hydroxide compound, ammonium bicarbonate, ammonium carbonate, sodium bicarbonate, and sodium carbonate is more preferably used.

The polishing composition (particularly, double-side polishing composition) preferably includes a potassium compound and a quaternary ammonium hydroxide compound as a basic compound. Examples of the potassium compound include a hydroxide of potassium and a salt thereof. Specific examples thereof include potassium hydroxide, potassium carbonate, potassium bicarbonate, potassium sulfate, potassium acetate, and potassium chloride. The polishing composition most preferably includes potassium hydroxide, potassium carbonate, and a tetraalkylammonium hydroxide such as tetramethylammonium hydroxide or tetraethylammonium hydroxide as a basic compound.

The content of the basic compound in the double-side polishing composition is preferably 0.01% by mass or more, more preferably 0.03% by mass or more. Increase in the content of the basic compound makes it easier to obtain a higher polishing speed. The content of the basic compound in the polishing composition is preferably less than 4% by mass, more preferably less than 3% by mass. Decrease in the content of the basic compound makes it easier to suppress deterioration of the shape of edges of an object to be polished. The lower limit of the content is particularly based on an assumption of a concentration in a form of dilution described below. The upper limit of the content is particularly based on an assumption of a concentration in a concentrated liquid described below.

The content of the basic compound in the single-side polishing composition is preferably 0.001% by mass or more, more preferably 0.003% by mass or more. Increase in the content of the basic compound makes it easier to obtain a higher polishing speed. The content of the basic compound in the polishing composition is preferably less than 2% by mass, more preferably less than 1% by mass. Decrease in the content of the basic compound makes it easier to maintain the shape of edges of an object to be polished. The lower limit of the content is particularly based on an assumption of a concentration in a form of dilution described below. The upper limit of the content is particularly based on an assumption of a concentration in a concentrated liquid described below.

[Surfactant]

The polishing composition (double-side polishing composition or single-side polishing composition) can include a surfactant. A surfactant suppresses roughness of a polishing surface of an object to be polished. This makes it easy to reduce the haze level of a polishing surface. Particularly when the polishing composition includes a basic compound, roughness of a polishing surface of an object to be polished tends to easily occur due to chemical polishing (chemical etching) by the basic compound. Therefore use of a basic compound in combination with a surfactant is particularly effective.

A surfactant having a weight average molecular weight of less than 1000 is preferable. Examples thereof include an anionic surfactant and a nonionic surfactant. Among the surfactants, a nonionic surfactant is preferably used. The nonionic surfactant has a low foaming property, and therefore is easily handled during preparation or use of the polishing composition. For example, it is easier to adjust the pH than in a case where an ionic surfactant is used.

Examples of the nonionic surfactant include an oxyalkylene polymer such as polyethylene glycol or polypropylene glycol, a polyoxyalkylene adduct such as polyoxyethylene alkyl ether, polyoxyethylene alkyl phenyl ether, polyoxyethylene alkylamine, polyoxyethylene fatty acid ester, polyoxy ethylene glycel ether fatty acid ester, or polyoxyethylene sorbitan fatty acid ester, a copolymer of a plurality of kinds of oxyalkylenes (diblock type, triblock type, random type, and alternating type).

Specific examples include a polyoxyethylene polyoxypropylene copolymer, polyoxyethylene glycol, polyoxyethylene propyl ether, polyoxyethylene butyl ether, polyoxyethylene pentyl ether, polyoxyethylene hexyl ether, polyoxyethylene octyl ether, polyoxyethylene-2-ethylhexyl ether, polyoxyethylene nonyl ether, polyoxyethylene decyl ether, polyoxyethylene isodecyl ether, polyoxyethylene tridecyl ether, polyoxyethylene lauryl ether, polyoxyethylene cetyl ether, polyoxyethylene stearyl ether, polyoxyethylene isostearyl ether, polyoxyethylene oleyl ether, polyoxyethylene phenyl ether, polyoxyethylene octyl phenyl ether, polyoxyethylene nonyl phenyl ether, polyoxyethylene dodecyl phenyl ether, polyoxyethylene styrenated phenyl ether, polyoxyethylene lauryl amine, polyoxyethylene stearyl amine, polyoxyethylene oleyl amine, polyoxyethylene stearyl amide, polyoxyethylene oleyl amide, polyoxyethylene monolaurate, polyoxyethylene monostearate, polyoxyethylene distearate, polyoxyethylene monooleate, polyoxyethylene dioleate, polyoxyethylene sorbitan monolaurate, polyoxyethylene sorbitan monopalmitate, polyoxyethylene sorbitan monostearate, polyoxyethylene sorbitan monooleate, polyoxyethylene sorbitan trioleate, polyoxyethylene sorbitol tetraoleate, polyoxyethylene castor oil, and polyoxyethylene hardened castor oil. Among these surfactants, polyoxyethylene alkyl ether, particularly polyoxyethylene decyl ether is preferably used.

One kind of these surfactants may be used alone or a combination of two or more kinds thereof may be used.

[Chelating Agent]

The polishing composition (double-side polishing composition or single-side polishing composition) can include a chelating agent. A chelating agent in the polishing composition (double-side polishing composition or single-side polishing composition) suppresses residual metal impurities in an object to be polished by capturing metal impurities originally included in the polishing composition, generated from the object to be polished or a polishing apparatus during polishing, or mixed from the outside, and forming a complex thereof. Particularly when the object to be polished is a semiconductor, by suppressing the residual metal impurities, metal contamination of the semiconductor is prevented, and quality deterioration of the semiconductor is suppressed.

Examples of the chelating agent include an aminocarboxylic acid chelating agent and an organic phosphonic acid chelating agent. Specific examples of the aminocarboxylic acid chelating agent include ethylenediamine tetraacetic acid, sodium ethylenediamine tetraacetate, nitrilotriacetic acid, sodium nitrilotriacetate, ammonium nitrilotriacetate, hydroxyethyl ethylenediamine triacetic acid, sodium hydroxyethyl ethylenediamine triacetate, diethylenetriamine pentaacetic acid, sodium diethylenetriamine pentaacetate, triethylenetetramine hexaacetic acid, and sodium triethylenetetramine hexaacetate.

Specific examples of the organic phosphonic acid chelating agent include 2-aminoethyl phosphonic acid, 1-hydroxyethylidene-1,1-diphosphonic acid, aminotri(methylene phosphonic acid), ethylenediamine tetrakis(methylene phosphonic acid), diethylenetriamine penta(methylene phosphonic acid), triethylenetetramine hexa(methylene phosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxy phosphonic acid, 2-phosphonobutane-1,2-dicarboxylic acid, 1-phosphonobutane-2,3,4-tricarboxylic acid, and α-methylphosphono succinic acid. One kind of these chelating agents may be used alone or a combination of two or more kinds thereof may be used.

Among the chelating agents, an organic phosphonic acid chelating agent is preferable, and ethylenediamine tetrakis (methylene phosphonic acid) is more preferable.

The content of the chelating agent in the polishing composition (double-side polishing composition or single-side polishing composition) is preferably 0.0001% by mass or more, more preferably 0.0005% by mass or more. Increase in the content of the chelating agent further suppresses residual metal impurities in an object to be polished. The content of the chelating agent in the polishing composition (double-side polishing composition or single-side polishing composition) is preferably 0.5% by mass or less, more preferably 0.1% by mass or less. Decrease in the content of the chelating agent further maintains storage stability of a polishing composition. The lower limit of the content is particularly based on an assumption of a concentration in a form of dilution described below. The upper limit of the content is particularly based on an assumption of a concentration in a concentrated liquid described below.

[Antiseptic Agent and Antifungal Agent]

The polishing composition (double-side polishing composition or single-side polishing composition) can include an antiseptic agent and an antifungal agent. Specific examples of the antiseptic agent and the antifungal agent include an isothiazolin compound, para-oxybenzonate, and phenoxyethanol.

[Components Other than the Above-Described Components]

The polishing composition may further include a known additive generally included in a polishing composition, such as an organic acid, an organic acid salt, an inorganic acid, or an inorganic acid salt, if necessary.

Examples of the organic acid include a fatty acid such as formic acid, acetic acid, propionic acid, or (meth) acrylic acid, an aromatic carboxylic acid such as benzoic acid or phthalic acid, citric acid, oxalic acid, tartaric acid, malic acid, maleic acid, fumaric acid, succinic acid, organic sulfonic acid, and organic phosphonic acid. Examples of the organic acid salt include an alkali metal salt such as a sodium salt of an organic acid or a potassium salt thereof, and an ammonium salt Examples of the inorganic acid salt include sulfuric acid, nitric acid, hydrochloric acid, and carbonic acid. Examples of the inorganic acid salt include an alkali metal salt such as a sodium salt of an inorganic acid or a potassium salt thereof, and an ammonium salt.

One kind of the organic acids and salts thereof, and the inorganic acids and salts thereof may be used alone or a combination of two or more kinds thereof may be used.

The above-described polishing composition (double-side polishing composition or single-side polishing composition) may be a one-component type or a multi-component type including two or more agents. The above-described polishing composition (double-side polishing composition or single-side polishing composition) may be used for polishing as it is. Alternatively, a polishing composition may be prepared and used for polishing by diluting a concentrated liquid of the polishing composition with water or by diluting a multi-component type polishing composition with an aqueous solution containing water and some components. For example, it is possible prepare a polishing composition by diluting a concentrated liquid of the polishing composition on its use after the concentrated liquid is stored or transported. That is, the concept of the polishing composition in the technique disclosed herein includes both a polishing liquid (working slurry) supplied to an object to be polished and used for polishing the object to be polished, and a concentrated liquid (stock solution of the polishing liquid) diluted and used as the polishing liquid.

A concentrated polishing composition is advantageous from viewpoints of convenience, reduction in cost, and the like, at the time of manufacturing, distribution, storage, or the like. A concentration magnification can be, for example, about 2 times to 100 times in terms of volume, and is usually suitably about 5 times to 50 times. The concentration magnification of a polishing composition (particularly, single-side polishing composition) according to a preferable embodiment is 10 times to 40 times, for example, 15 times to 25 times, for example, 18 times to 22 times. The concentration magnification of a polishing composition (particularly, double-side polishing composition) according to another preferable embodiment is 10 times to 40 times, for example, 20 times to 35 times, for example, 28 times to 32 times.

Second Embodiment of the First Aspect of the Present Invention

The second embodiment of the first aspect of the present invention includes a double-side polishing step in which a silicon wafer is subjected to double-side polishing using a double-side polishing composition to obtain a double-side polished silicon wafer, and a single-side polishing step in which the double-side polished silicon wafer is subjected to single-side polishing using a single-side polishing composition. The single-side polishing step is performed twice. Performing the single-side polishing step twice is preferable from a viewpoint of productivity. Of the two single-side polishing steps, the first polishing is also referred to as "single-side polishing at a first stage, and the subsequent polishing is also referred to as "single-side polishing at a second stage."

A difference between the first embodiment of the first aspect of the present invention and the second embodiment of the first aspect of the present invention is the number of the single-side polishing step. The description of the first embodiment of the first aspect of the present invention is basically applied to other parts in the second embodiment of the first aspect of the present invention. As a modification example of the second embodiment of the first aspect of the present invention, the double-side polishing step may be performed two or more times, and the single-side polishing step may be performed three or more times. The upper limit of the number of the double-side polishing step is about three. The upper limit of the number of the single-side polishing step is about six.

In the second embodiment of the first aspect of the present invention, in the single-side polishing step at a first stage and the single-side polishing step at a second stage, single-side polishing is performed. Therefore, the second abrasive grains are used in both the steps. These second abrasive grains may have different particle diameters or the same particle diameter as long as the second abrasive grains have an average primary particle diameter of 40 nm or less and (A)/(B) is more than 1 and 2.5 or less. However, the second abrasive grains having the same particle diameter are preferably used from a viewpoint of workability. When the second abrasive grains having different particle diameters are used, the second abrasive grains used in single-side polishing at the second stage are preferably smaller than those used in single-side polishing at the first stage. The ratio thereof is preferably about 0.9 to 0.5 or about 0.8 to 0.7.

In the second embodiment of the first aspect of the present invention, the single-side polishing step is performed twice, and therefore the single-side polishing step at the second stage is the last single-side polishing step. A water-soluble polymer used in the last single-side polishing step preferably includes at least one selected from a polymer containing an oxyalkylene unit, a nitrogen-containing water-soluble polymer, polyvinyl alcohol, and a cellulose derivative, and particularly preferably includes a cellulose derivative. In this way, by using a cellulose derivative in the last single-side polishing step, the number of LLS is particularly reduced, the haze (relative value) is particularly reduced, the above-described minimum polishing amount is particularly small, and the polishing speed is high. This is similarly applied to a case where the single-side polishing step is performed three times or more. When the single-side polishing step is performed three times, by using a cellulose derivative in a single-side polishing step at a third stage, a similar effect can be obtained.

<Second Aspect of the Present Invention>

A second aspect of the present invention is a polishing composition kit which includes first abrasive grains having an average primary particle diameter of 40 nm or more, used in double-side polishing, a nitrogen-containing water-soluble polymer used in double-side polishing, second abrasive grains having an average primary particle diameter of 40 nm or less, used in single-side polishing, and a water-soluble polymer used in single-side polishing, and in which a ratio of an average primary particle diameter (A) of the first abrasive grains with respect to an average primary particle diameter (B) of the second abrasive grains (A)/(B) is more than 1 and 2.5 or less. By performing double-side polishing and single-side polishing using the polishing composition kit of the second aspect of the present invention, an effect similar to the first aspect of the present invention can be obtained. The description of the first aspect of the present invention is similarly applied to the first abrasive grains, the nitrogen-containing water-soluble polymer, the second abrasive grains, the water-soluble polymer, and the ratio of the average primary particle diameter (A) of the first abrasive grains with respect to the average primary particle diameter (B) of the second abrasive grains (A)/(B). Therefore, description thereof will be omitted here.

A form of the polishing composition kit is not particularly limited. A double-side polishing composition in which first abrasive grains and a nitrogen-containing water-soluble polymer are mixed in advance and a single-side polishing composition in which second abrasive grains and a water-soluble polymer are mixed in advance are stored in separate containers, and may be packed together or separately. The double-side polishing composition and the single-side polishing composition do not have to be packed. Even when the double-side polishing composition and the single-side polishing composition are placed on a shelf or the like in order to be used in double-side polishing and single-side polishing, respectively, these compositions are regarded as the polishing composition kit of the present invention. Alternatively, even when first abrasive grains used in double-side polishing, a nitrogen-containing water-soluble polymer used in double-side polishing, second abrasive grains used in single-side polishing, and a water-soluble polymer used in single-side polishing are stored in separate containers without being mixed in advance, these are regarded as the polishing composition kit of the present invention. As in the second embodiment of the first aspect of the present invention, similarly also when there are two kinds of single-side polishing compositions, even when two single-side polishing compositions in which second abrasive grains and a water-soluble polymer are mixed in advance are prepared, these compositions are regarded as the polishing composition kit of the present invention. Even when second abrasive grains and a water-soluble polymer are stored in separate containers, these are regarded as the polishing composition kit of the present invention.

That is, when first abrasive grains and a nitrogen-containing water-soluble polymer are prepared in order to be used in double-side polishing, and second abrasive grains and a water-soluble polymer are prepared in order to be used in single-side polishing, these are included in the concept of the polishing composition kit of the second aspect of the present invention.

EXAMPLES

Next, the present embodiment will be described more specifically with Examples and Comparative Examples.

Double-side polishing compositions obtained by mixing colloidal silica, a water-soluble polymer compound (nitrogen-containing water-soluble polymer compound), and ion exchange water, used in Examples 1 to 26 and Comparative Examples 1 to 12 were prepared so as to obtain the compositions shown in Table 1. Single-side polishing compositions obtained by mixing colloidal silica, a water-soluble polymer compound, and ion exchange water, used in Examples 1 to 26 and Comparative Examples 1 to 12 were prepared so as to obtain the compositions shown in Table 1. Details of double-side polishing compositions (preliminary polishing compositions in double-side polishing processing) and single-side polishing compositions (final polishing compositions in single-side polishing processing) in Examples and Comparative Examples are shown in Table 1. Preparation was performed by stirring and mixing the components (mixing temperature: about 25° C., mixing time: about 10 minutes).

"BET particle diameter" and "average secondary particle diameter" in Table 1 indicate an average primary particle diameter and an average secondary particle diameter calculated from a specific surface area (BET method) measured using "Flow SorbII 2300" manufactured by Micromeritics Japan, respectively.

"Content of colloidal silica % by mass" in Table 1 indicates a content of colloidal silica included in 100% by mass of a double-side polishing composition or a single-side polishing composition.

In the column "kind of water-soluble polymer" in Table 1, "HEC" indicates hydroxyethyl cellulose, "PVP" indicates polyvinyl pyrrolidone, "PNVF" indicates poly N-vinylformamide, "PEG" indicates polyethylene glycol, and "PEO" indicates polyethylene oxide.

"Water-soluble polymer Mw" in Table 1 indicates a weight average molecular weight of a nitrogen-containing water-soluble polymer compound included in a double-side polishing composition (in terms of polyethylene oxide) and a weight average molecular weight of a water-soluble polymer included in a single-side polishing composition (in terms of polyethylene oxide).

"Content of water-soluble polymer % by mass" in the column "preliminary polishing composition in double-side polishing processing" in Table 1 indicates a content of a nitrogen-containing water-soluble polymer included in 100% by mass of a double-side polishing composition.

"Content of water-soluble polymer % by mass" in the column "final polishing composition in single-side polishing processing" in Table 1 indicates a content of a water-soluble polymer included in 100% by mass of a single-side polishing composition.

Note the contents of colloidal silica in final polishing compositions (single-side polishing compositions) in single-side polishing processing were all 9% by mass.

Next, using a polishing liquid obtained by diluting a double-side polishing composition (preliminary polishing composition in double-side polishing processing) having a composition shown in each of Examples 1 to 25 and Comparative Examples 1 to 11 with pure water by 30 times, a silicon wafer (diameter: 300 mm, conductivity type: P-type, crystal orientation: <100>, resistivity: 1 Ω·cm or more and less than 100 Ω·cm) was subjected to double-side polishing once under polishing conditions 1 described in Table 2 to obtain a double-side polished silicon wafer. Subsequently, the silicon wafer was rinsed once. The double-side polished silicon wafer was subjected to single-side polishing once under polishing conditions 3 described in Table 2 using a polishing liquid obtained by diluting a single-side polishing composition (final polishing composition in single-side polishing processing) having a composition shown in each of Examples 1 to 25 and Comparative Examples 1 to 11 with pure water by 20 times.

In Examples 26 and Comparative Example 12, using a polishing liquid obtained by diluting a double-side polishing composition (preliminary polishing composition in double-side polishing processing) with pure water by 30 times, the above-described silicon wafer was subjected to double-side polishing once under polishing conditions 1 described in Table 2 to obtain a double-side polished silicon wafer. Subsequently, the silicon wafer was rinsed once. The double-side polished silicon wafer was subjected to single-side polishing under polishing conditions 3 described in Table 2 using a polishing liquid obtained by diluting a single-side polishing composition (final polishing composition in single-side polishing processing 1) having a composition shown in each of Examples 26 and Comparative Example 12 with pure water by 20 times. Thereafter, the silicon wafer was subjected to single-side polishing under polishing conditions 3 described in Table 2 using a polishing liquid obtained by diluting a single-side polishing composition (final polishing composition in single-side polishing processing 2) with pure water by 20 times.

The rinsing composition used in rinsing includes 0.01% by mass of hydroxyethyl cellulose, 0.0005% by mass of ammonia, and ion exchange water. Rinsing was performed under conditions by replacing the polishing composition of the polishing conditions 1 with the rinsing composition.

Components other than those described in Table 1 will be described below.

<Double-Side Polishing Composition>

As a basic compound, 1.5% by mass of tetramethylammonium hydroxide (TMAH) and 1.0% by mass of potassium carbonate ($K_2CO_3$) (for acceleration of polishing and pH buffering) were included. As a chelating agent (for capturing metal impurities), 0.1% by mass of ethylenediamine tetramethylene phosphonic acid (EDTPO) was included. The remaining was water.

<Single-Side Polishing Composition>

As a basic compound, 0.2% by mass of ammonia was used.

<The Number of LLS>

The number of LLS (Localized Light Scatters) in Table 1 was measured using a wafer inspection apparatus "Surfscan SP2" manufactured by KLA-Tencor Corporation. "⊙" shown in the "number of LLS (37 nm or more)" in Table 1 indicates the number of LLS of 20 or less, "○" indicates 21 to 50, "Δ" indicates 51 to 100, and "x" indicates 101 or more.

<Haze (Relative Value)>

The column "haze (relative value)" in Table 1 indicates results obtained by measuring a haze level on the surface of the silicon wafer after double-side polishing and single-side polishing. Specifically, the haze level was measured using a wafer inspection apparatus "Surfscan SP2" manufactured by KLA-Tencor Corporation, and was represented by a numerical value in DNO (Dark Narrow Oblique) mode (unit: ppb).

<Laser Marking Height>

The laser marking height is a parameter indicating a maximum section height of a roughness curve using HRP340 manufactured by KLA-Tencor Corporation, and indicates a difference in the height of a surface of a silicon wafer between the highest part and the lowest part in a fixed field of view (1 mm×5 mm).

"⊙" shown in the "laser marking height" in Table 1 indicates the laser marking height of 30 nm or less, ○ indicates the laser marking height of 31 to 50 nm, Δ indicates the laser marking height of 51 to 70 nm, and x indicates the laser marking height of 71 nm or more.

<ESFQR>

An average value of ESFQRs obtained by performing measurement under the conditions of a site length of 35 mm and an edge exclusion region of 1 mm (72 sites in total) using a wafer flatness measurement device "Wafer Sight 2" manufactured by KLA-Tencor Corporation, is shown.

⊙ shown in "ESFQR" in Table 1 indicates 50 nm or less, ○ indicates 51 to 70 nm, Δ indicates 71 to 100 nm, and x indicates 101 nm or more.

<Minimum Polishing Amount in Single-Side Polishing Processing in which LLS is Evaluated as ⊙>

The minimum polishing amount in single-side polishing processing in which LLS was evaluated as ⊙ was calculated by measuring the minimum polishing amount until the number of LLS became 20 or less in the above-described measurement of the number of LLS.

Results are shown in Table 1. In Comparative Examples 3 to 5 and 11, however hard the surface was polished, it was not possible to make the number of LLS 20 or less.

TABLE 1

| No. | Preliminary polishing compositions in double-side polishing processing | | | | | | Final polishing compositions in single-side polishing processing | |
|---|---|---|---|---|---|---|---|---|
| | BET particle diameter of colloidal silica nm (A) | Average secondary particle diameter of colloidal silica nm | Content of colloidal silica % by mass | Kind of water-soluble polymer | Water-soluble polymer Mw | Content of water-soluble polymer % by mass | BET particle diameter of colloidal silica nm (B) | Kind of water-soluble polymer |
| Example 1 | 40 | 100 | 35 | PVP | 45000 | 0.007 | 35 | HEC |
| Example 2 | 50 | 100 | 35 | PVP | 45000 | 0.007 | 40 | HEC |
| Example 3 | 50 | 100 | 35 | PVP | 45000 | 0.007 | 35 | HEC |
| Example 4 | 55 | 110 | 35 | PVP | 45000 | 0.007 | 35 | HEC |
| Example 5 | 40 | 100 | 35 | PVP | 45000 | 0.007 | 25 | HEC |
| Example 6 | 70 | 150 | 35 | PVP | 45000 | 0.007 | 40 | HEC |
| Example 7 | 70 | 150 | 35 | PVP | 45000 | 0.007 | 35 | HEC |
| Example 8 | 50 | 100 | 35 | PVP | 45000 | 0.007 | 25 | HEC |
| Example 9 | 55 | 110 | 35 | PVP | 45000 | 0.007 | 25 | HEC |
| Example 10 | 90 | 180 | 35 | PVP | 45000 | 0.007 | 40 | HEC |
| Example 11 | 50 | 80 | 35 | PVP | 45000 | 0.007 | 35 | HEC |
| Example 12 | 50 | 120 | 35 | PVP | 45000 | 0.007 | 35 | HEC |
| Example 13 | 50 | 100 | 9 | PVP | 45000 | 0.007 | 35 | HEC |
| Example 14 | 50 | 100 | 18 | PVP | 45000 | 0.007 | 35 | HEC |
| Example 15 | 50 | 100 | 45 | PVP | 45000 | 0.007 | 35 | HEC |
| Example 16 | 50 | 100 | 35 | PVP | 5000 | 0.007 | 35 | HEC |
| Example 17 | 50 | 100 | 35 | PVP | 10000 | 0.007 | 35 | HEC |
| Example 18 | 50 | 100 | 35 | PVP | 90000 | 0.007 | 35 | HEC |
| Example 19 | 50 | 100 | 35 | PVP | 140000 | 0.007 | 35 | HEC |
| Example 20 | 50 | 100 | 35 | PVP | 45000 | 0.003 | 35 | HEC |
| Example 21 | 50 | 100 | 35 | PVP | 45000 | 0.005 | 35 | HEC |
| Example 22 | 50 | 100 | 35 | PVP | 45000 | 0.01 | 35 | HEC |
| Example 23 | 50 | 100 | 35 | PVP | 45000 | 0.015 | 35 | HEC |
| Example 24 | 50 | 100 | 35 | PVP | 45000 | 0.007 | 35 | HEC PVP |
| Example 25 | 50 | 100 | 35 | PNVF | 100000 | 0.007 | 35 | HEC |
| Comparative Example 1 | 50 | 100 | 35 | PEG | 26000 | 0.007 | 35 | HEC |
| Comparative Example 2 | 50 | 100 | 35 | PEO | 200000 | 0.007 | 35 | HEC |
| Comparative Example 3 | 50 | 100 | 35 | PVP | 45000 | 0.007 | 50 | HEC |
| Comparative Example 4 | 70 | 150 | 35 | PVP | 45000 | 0.007 | 55 | HEC |
| Comparative Example 5 | 70 | 150 | 35 | PVP | 45000 | 0.007 | 50 | HEC |
| Comparative Example 6 | 50 | 100 | 35 | HEC | 1000000 | 0.007 | 35 | HEC |
| Comparative Example 7 | 90 | 180 | 35 | PVP | 45000 | 0.007 | 35 | HEC |
| Comparative Example 8 | 70 | 150 | 35 | PVP | 45000 | 0.007 | 25 | HEC |
| Comparative Example 9 | 90 | 180 | 35 | PVP | 45000 | 0.007 | 25 | HEC |
| Comparative Example 10 | 40 | 100 | 35 | PVP | 45000 | 0.007 | 40 | HEC |
| Comparative Example 11 | 70 | 150 | 35 | PVP | 45000 | 0.007 | 120 | HEC |

| No. | Final polishing compositions in single-side polishing processing | | (A)/(B) | Number of LLS (37 nm or more) | Haze (relative value) | Laser marking height | ESFQR | Minimum polishing amount in single-side polishing processing in which LLS is evaluated as ⊙ |
|---|---|---|---|---|---|---|---|---|
| | Water-soluble polymer Mw | Content of water-soluble polymer % by mass | | | | | | |
| Example 1 | 250,000 | 0.3 | 1.1 | ○ | 23 | Δ | ⊙ | 250 nm |
| Example 2 | 250,000 | 0.3 | 1.3 | ○ | 25 | ⊙ | ⊙ | 350 nm |
| Example 3 | 250,000 | 0.3 | 1.4 | ○ | 23 | ⊙ | ⊙ | 250 nm |
| Example 4 | 250,000 | 0.3 | 1.6 | ○ | 23 | ⊙ | ⊙ | 300 nm |
| Example 5 | 250,000 | 0.3 | 1.6 | ⊙ | 20 | Δ | Δ | 250 nm |
| Example 6 | 250,000 | 0.3 | 1.8 | Δ | 25 | ⊙ | ⊙ | 350 nm |
| Example 7 | 250,000 | 0.3 | 2.0 | ○ | 23 | ⊙ | ⊙ | 250 nm |
| Example 8 | 250,000 | 0.3 | 2.0 | ⊙ | 19 | ⊙ | ⊙ | 200 nm |
| Example 9 | 250,000 | 0.3 | 2.2 | ⊙ | 21 | ⊙ | ⊙ | 250 nm |

TABLE 1-continued

| | | | | | | | | | |
|---|---|---|---|---|---|---|---|---|---|
| Example 10 | 250,000 | 0.3 | 2.3 | ○ | 26 | ⊙ | ⊙ | 550 nm | |
| Example 11 | 250,000 | 0.3 | 1.4 | ○ | 23 | ⊙ | ⊙ | 300 nm | |
| Example 12 | 250,000 | 0.3 | 1.4 | ○ | 23 | ⊙ | ⊙ | 300 nm | |
| Example 13 | 250,000 | 0.3 | 1.4 | ○ | 23 | ⊙ | ⊙ | 300 nm | |
| Example 14 | 250,000 | 0.3 | 1.4 | ○ | 23 | ⊙ | ○ | 300 nm | |
| Example 15 | 250,000 | 0.3 | 1.4 | ○ | 23 | ⊙ | ○ | 300 nm | |
| Example 16 | 250,000 | 0.3 | 1.4 | ○ | 23 | ⊙ | ⊙ | 250 nm | |
| Example 17 | 250,000 | 0.3 | 1.4 | ○ | 23 | ⊙ | ⊙ | 250 nm | |
| Example 18 | 250,000 | 0.3 | 1.4 | ○ | 23 | ⊙ | ⊙ | 300 nm | |
| Example 19 | 250,000 | 0.3 | 1.4 | ○ | 23 | ⊙ | ⊙ | 300 nm | |
| Example 20 | 250,000 | 0.3 | 1.4 | ○ | 23 | ⊙ | ⊙ | 300 nm | |
| Example 21 | 250,000 | 0.3 | 1.4 | ○ | 24 | ⊙ | ⊙ | 300 nm | |
| Example 22 | 250,000 | 0.3 | 1.4 | ○ | 23 | ⊙ | ⊙ | 300 nm | |
| Example 23 | 250,000 | 0.3 | 1.4 | Δ | 23 | ○ | ⊙ | 350 nm | |
| Example 24 | 250,000 45,000 | 0.15 | 1.4 | ⊙ | 22 | ⊙ | ⊙ | 200 nm | |
| Example 25 | 250,000 | 0.3 | 1.4 | ○ | 23 | ⊙ | ⊙ | 300 nm | |
| Comparative Example 1 | 250,000 | 0.3 | 1.4 | X | 23 | ⊙ | Δ | 350 nm | |
| Comparative Example 2 | 250,000 | 0.3 | 1.4 | X | 23 | ⊙ | Δ | 350 nm | |
| Comparative Example 3 | 250,000 | 0.3 | 1.0 | X | 52 | ⊙ | ⊙ | not to be ⊙ | |
| Comparative Example 4 | 250,000 | 0.3 | 1.3 | X | 52 | ⊙ | ⊙ | not to be ⊙ | |
| Comparative Example 5 | 250,000 | 0.3 | 1.4 | X | 52 | ⊙ | ⊙ | not to be ⊙ | |
| Comparative Example 6 | 250,000 | 0.3 | 1.4 | Δ | 24 | Δ | Δ | 300 nm | |
| Comparative Example 7 | 250,000 | 0.3 | 2.6 | Δ | 24 | ⊙ | ⊙ | 550 nm | |
| Comparative Example 8 | 250,000 | 0.3 | 2.8 | X | 22 | ⊙ | ⊙ | 500 nm | |
| Comparative Example 9 | 250,000 | 0.3 | 3.6 | Δ | 21 | ⊙ | ⊙ | 550 nm | |
| Comparative Example 10 | 250,000 | 0.3 | 1.0 | Δ | 23 | Δ | ○ | 300 nm | |
| Comparative Example 11 | 250,000 | 0.3 | 0.6 | X | 78 | ⊙ | ⊙ | not to be ⊙ | |

| | Preliminary polishing compositions in double-side polishing processing | | | | | Final polishing compositions in single-side polishing processing 1 | | | | |
|---|---|---|---|---|---|---|---|---|---|---|
| | BET particle diameter of colloidal silica nm (A) | Average secondary particle diameter of colloidal silica nm | Content of colloidal silica % by mass | Kind of water-soluble polymer | Water-soluble polymer Mw | Content of water-soluble polymer % by mass | BET particle diameter of colloidal silica nm (B) | Kind of water-soluble polymer | Water-soluble polymer Mw | Content of water-soluble polymer % by mass | (A)/(B) |
| Example 26 | 50 | 100 | 35 | PVP | 45000 | 0.007 | 35 | PVP | 45000 | 0.03 | 1.4 |
| Comparative Example 12 | 90 | 100 | 35 | PVP | 45000 | 0.007 | 35 | PVP | 45000 | 0.03 | 2.6 |

| | | | | | Minimum polishing amount in single-side polishing processing in which LLS is evaluated as ⊙ | Final polishing compositions in single-side polishing processing 2 | | | |
|---|---|---|---|---|---|---|---|---|---|
| | Number of LLS (37 nm or more) | Haze (relative value) | Laser marking height | ESFQR | | BET particle diameter of colloidal silica nm (B) | Kind of water-soluble polymer | Water-soluble polymer Mw | Content of water-soluble polymer % by mass | (A)/(B) |
| Example 26 | ⊙ | 21 | ⊙ | ⊙ | 250 nm | 35 | HEC | 250,000 | 0.3 | 1.4 |
| Comparative Example 12 | Δ | 23 | ⊙ | ⊙ | 500 nm | 35 | HEC | 250,000 | 0.3 | 2.6 |

TABLE 2

Polishing condition 1

| | |
|---|---|
| Polishing apparatus | double-side polishing machine (DSM20B-5P-4D; manufactured by SpeedFam Company Limited) |
| Load | 15 KPa |
| Relative rotational number of upper plate | 20 rpm |
| Relative rotational number of lower plate | 20 rpm |
| Polishing pad | MH-S15A (manufactured by Nitta Haas Incorporated) |
| Feeding speed of polishing composition | 4 L per minute |
| Polishing time | 30 to 50 minutes (depending on polishing amount) |
| Polishing amount | 15 μm |
| Holding temperature of polishing composition | 23° C. |

TABLE 3

Polishing condition 3

| | |
|---|---|
| Polishing apparatus | single-side polishing apparatus (PNX-332B; manufactured by Okamoto Machine Tool Works, Ltd.) |
| Load | 15 KPa |
| Rotational number of plate | 30 rpm |
| Rotational number of object to be polished | 30 rpm |
| Polishing pad | POLYPAS 27NX (manufactured by Fujibo Holdings, Inc.) |
| Feeding speed of polishing composition | 1 L per minute |
| Polishing time | 8 minutes |
| Polishing amount | 0.25 μm or more |
| Holding temperature of polishing composition | 20° C. |

<Discussion>

Examples 1 to 26, generally, it is possible to remarkably reduce the haze level and to significantly reduce defects. In addition, it is possible to lower the laser marking height and to improve a numerical value of ESFQR indicating local flatness of a wafer edge portion.

On the other hand, in Comparative Examples 1 and 2, a double-side polishing composition does not include a nitrogen-containing water-soluble polymer, and therefore the number of LLS is very large. That is, it is not possible to reduce the haze level and to significantly reduce defects.

In Comparative Examples 3 to 5 and 11, both the haze level and the number of LLS are very poor. This is because the requirement that the average primary particle diameter of the second abrasive grains is 40 nm or less, is not satisfied.

In Comparative Example 6, a nitrogen-containing water-soluble polymer is not included, but HEC having high ability to impart wettability to a polished surface and excellent cleaning performance is used, and therefore the results are relatively good. However, the number of LLS is larger than that in Example 3 in which conditions other than this point are the same. It can be said from this viewpoint that it is not possible to reduce the haze level and to significantly reduce defects. Similarly, in Comparative Examples 7 and 12, (A)/(B) is 2.6. Therefore, the number of LLS is larger than those in Examples 10 and 26 in which conditions other than the particle diameter (B) are the same. It can be said from this viewpoint that it is not possible to reduce the haze level and to significantly reduce defects. In this point, an upper limit critical point of (A)/(B) can be suggested to be 2.5 or less. Comparative Example 9 is similarly discussed.

Also Comparative Example 8 does not satisfy the prescribed (A)/(B). Therefore, the number of LLS is larger than that in Example 7 in which conditions other than (A)/(B) are the same. It can be said from this viewpoint that it is not possible to reduce the haze level and to significantly reduce defects.

Also Comparative Example 10 does not satisfy the prescribed (A)/(B). Therefore, the number of LLS is larger than that in Example 1 in which conditions other than (A)/(B) are the same. It can be said from this viewpoint that it is not possible to reduce the haze level and to significantly reduce defects. In this point, a lower limit critical point of (A)/(B) can be suggested to more than 1.

The present application is based on the Japanese patent application No. 2013-166142 filed on Aug. 9, 2013. The disclosed contents thereof are referred to and incorporated here as a whole.

REFERENCE SIGNS LIST

11: single-side polishing apparatus
14: polishing pad
12: rotary plate
13a: arrow
13: first shaft
15: wafer holder
16: second shaft
16a: arrow
17: ceramic plate
18: wafer holding hole
19: wafer holding plate
21: polishing composition feeder
21a: nozzle
22: double-side polishing apparatus
23: lower plate
24: upper plate
25: processing carrier
26: polishing composition feeding gutter

The invention claimed is:

1. A method for producing a polished object, comprising:
   a double-side polishing step in which an object to be polished is subjected to double-side polishing using a double-side polishing composition including first abrasive grains having an average primary particle diameter of 40 nm or more and a nitrogen-containing water-soluble polymer to obtain a double-side polished object; and
   a single-side polishing step in which the double-side polished object is subjected to single-side polishing using a single-side polishing composition including second abrasive grains having an average primary particle diameter of 40 nm or less and a water-soluble polymer, wherein
   a ratio of an average primary particle diameter (A) of the first abrasive grains with respect to an average primary particle diameter (B) of the second abrasive grains (A)/(B) is more than 1 and 2.5 or less, and
   wherein the concentration of the water-soluble polymer in the single-side polishing composition is 5 times higher than that of the nitrogen-containing water-soluble polymer in the double-side polishing composition.

2. The method for producing a polished object according to claim 1, wherein (A)/(B) is 1.6 or more and less than 2.3.

3. The method for producing a polished object according to claim 1, wherein the nitrogen-containing water-soluble polymer has one or more nitrogen atoms in a monomer unit, or one or more nitrogen atoms in a part of side chain.

4. The method for producing a polished object according to claim 1, wherein the nitrogen-containing water-soluble polymer is selected from the group consisting of polyvinyl imidazole, polyvinyl carbazole, polyvinyl pyrrolidone, poly N-vinylformamide, polyvinyl caprolactam, and polyvinyl piperidine.

5. The method for producing a polished object according to claim 1, wherein
the single-side polishing step is performed multiple times, and
a water-soluble polymer used in the last single-side polishing step includes at least one selected from a polymer containing an oxyalkylene unit, a nitrogen-containing water-soluble polymer, polyvinyl alcohol, and a cellulose derivative.

6. The method for producing a polished object according to claim 1, wherein the object to be polished is a semiconductor wafer.

7. The method for producing a polished object according to claim 6, wherein the semiconductor is silicon.

8. A polishing composition kit comprising:
first abrasive grains having an average primary particle diameter of 40 nm or more, used in double-side polishing; a nitrogen-containing water-soluble polymer used in double-side polishing;
second abrasive grains having an average primary particle diameter of 40 nm or less, used in single-side polishing; and a water-soluble polymer used in single-side polishing, wherein
a ratio of an average primary particle diameter (A) of the first abrasive grains with respect to an average primary particle diameter (B) of the second abrasive grains (A)/(B) is more than 1 and 2.5 or less, and
wherein the concentration of the water-soluble polymer in the single-side polishing composition is 5 times higher than that of the nitrogen-containing water-soluble polymer in the double-side polishing composition.

9. A double-side polishing composition used in the method for producing a polished object according to claim 1,
wherein the double-side polishing composition comprises abrasive grains having an average primary particle diameter of 40 nm or more and a nitrogen-containing water-soluble polymer.

10. A single-side polishing composition used in the method for producing a polished object according to claim 1,
wherein the single-side polishing composition comprises abrasive grains having an average primary particle diameter of 40 nm or less and a water-soluble polymer.

* * * * *